United States Patent
Kim et al.

(10) Patent No.: US 7,978,554 B2
(45) Date of Patent: Jul. 12, 2011

(54) SEMICONDUCTOR MEMORY DEVICE AND METHOD OF OPERATING THE SAME

(75) Inventors: Kyung-Woo Kim, Seoul (KR); Jong-Sin Yun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 12/500,242

(22) Filed: Jul. 9, 2009

(65) Prior Publication Data
US 2010/0061171 A1     Mar. 11, 2010

(30) Foreign Application Priority Data
Sep. 8, 2008 (KR) .................... 10-2008-0088473

(51) Int. Cl.
*G11C 7/14* (2006.01)
(52) U.S. Cl. ................ 365/210.1; 154/227; 154/189.09; 154/226; 154/51
(58) Field of Classification Search .................. 365/154, 365/227, 189.09, 210.1, 226, 51
See application file for complete search history.

(56) References Cited

U.S. PATENT DOCUMENTS

| | | | |
|---|---|---|---|
| 6,804,143 B1 | 10/2004 | Hobson | |
| 7,292,485 B1 * | 11/2007 | Lu et al. | 365/189.09 |
| 7,324,368 B2 | 1/2008 | Wang et al. | |
| 2007/0263447 A1 | 11/2007 | Koike et al. | |
| 2007/0268738 A1 | 11/2007 | Heinrich-Barna et al. | |

* cited by examiner

*Primary Examiner* — Hoai V Ho
*Assistant Examiner* — Jay Radke
(74) *Attorney, Agent, or Firm* — F. Chau & Associates LLC

(57) ABSTRACT

A semiconductor memory device includes a plurality of word lines, a plurality of pairs of bit lines and complementary bit lines, and a plurality of memory cells, each memory cell being disposed at a region where a respective word line and a pair of a bit line and a complementary bit line cross each other. A voltage control unit controls a power voltage to obtain a controlled voltage appliable to the memory cells in response to a control signal that controls an operation of the memory cells. At least one dummy cell is disposed between the voltage control unit and the memory cells and is configured to reduce the controlled voltage to a predetermined level.

14 Claims, 4 Drawing Sheets

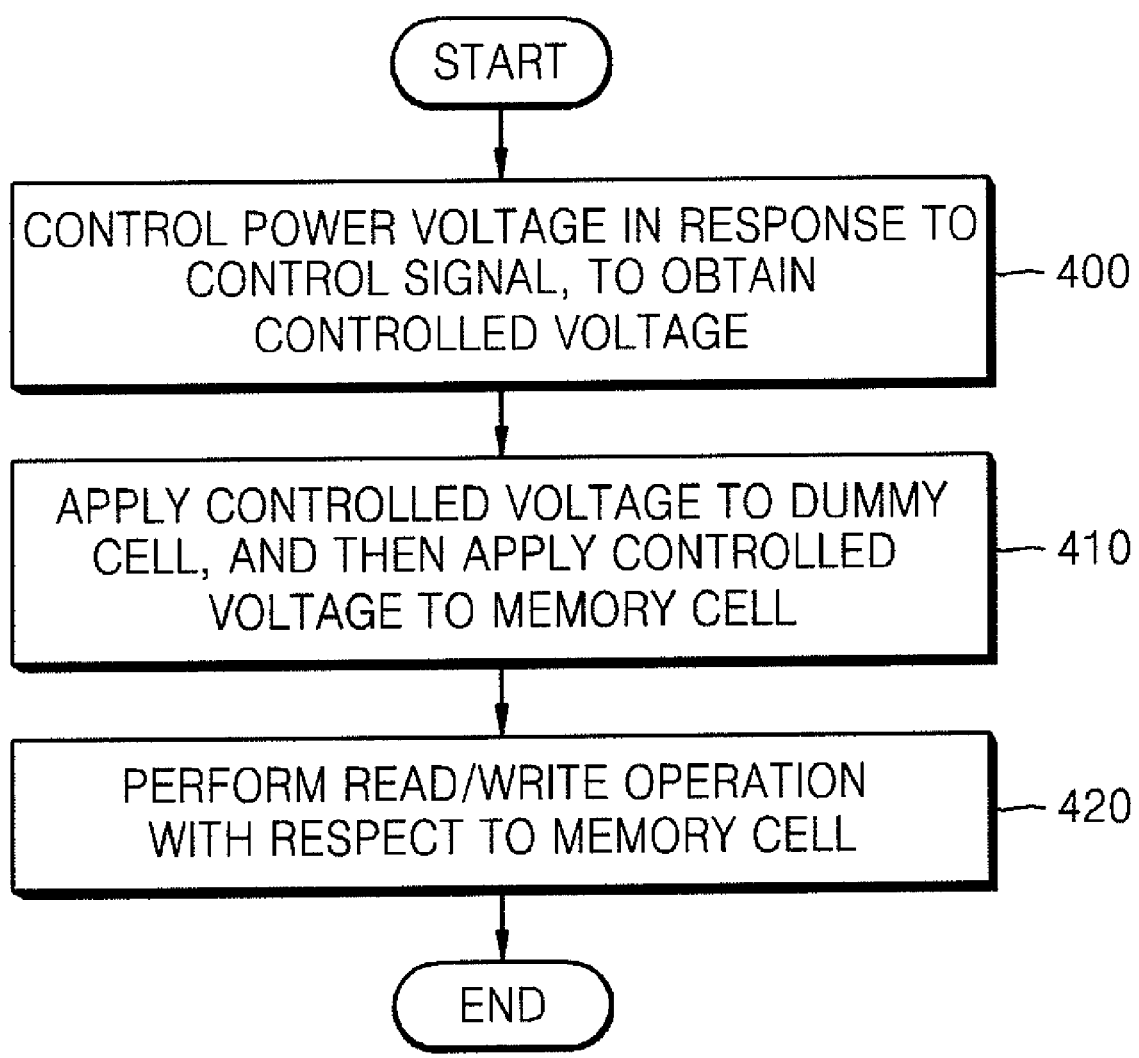

SEMICONDUCTOR MEMORY DEVICE AND METHOD OF OPERATING THE SAME

CROSS-REFERENCE TO RELATED APPLICATION

This application claims priority to and the benefit of Korean Patent Application No. 10-2008-0088473, filed on Sep. 8, 2008, in the Korean Intellectual Property Office, the entire content of which is incorporated by reference herein.

BACKGROUND

The present disclosure relates to memory devices, and more particularly, to a semiconductor memory device that performs a stable write operation and a method of manufacturing the semiconductor memory device.

Semiconductor memory devices, which store data, are largely categorized into volatile memory devices and non-volatile memory devices. Volatile memory devices lose their stored data when their power supplies are removed, while non-volatile memory devices retain their stored data even when their power supplies are removed.

Examples of volatile memory devices include dynamic random access memory (DRAM) devices and static RAM (SRAM) devices. SRAM devices have lower power consumption and operate at a faster speed than DRAM devices, and thus SRAM devices are used as cache memory.

As SRAM memory cells become miniaturized, the size of the cells and the power voltages applied to the cells have decreased. As such, write assist elements that provide power voltages to the typical pair of cross-coupled inverters in the SRAM have become prevalent and the application of a reduced power voltage from the write assist elements during a write operation becomes needed for a stable write operation.

SUMMARY OF THE INVENTION

In accordance with an exemplary embodiment of the present invention, a semiconductor memory device includes a plurality of word lines, a plurality of pairs of bit lines and complementary bit lines, and a plurality of memory cells, each memory cell being disposed at a region where a respective word line and a pair of a bit line and a complementary bit line cross each other. A voltage control unit controls a power voltage to obtain a controlled voltage appliable to the memory cells in response to a control signal that controls an operation of the memory cells. At least one dummy cell is disposed between the voltage control unit and the memory cells and is configured to reduce the controlled voltage to a predetermined level.

Each of the memory cells and the at least one dummy cell may include a first inverter and a second inverter to which the controlled voltage is applied and that are cross-coupled to each other. A first access transistor may be disposed between a first bit line of the pair and an output terminal of the first inverter and is switched on/off by a first word line of the plurality of word line. A second access transistor may be disposed between a first complementary bit line corresponding to the first bit line and an output terminal of the second inverter and is switched on/off by the first word line.

Widths of channels of the first access transistor and the second access transistor in the at least one dummy cell may be greater than widths of channels of the first access transistor and the second access transistor in each of the plurality of memory cells.

The control signal may include a power gating control signal and a write enable signal.

The voltage control unit may include a logic gate that performs a logic operation on the power gating control signal and the write enable signal, and a first switch that is switched on/off in response to an output of the logic gate.

The logic gate may include a NAND gate that performs a NAND operation on the power gating control signal and the write enable signal.

The first switch may be a first PMOS transistor, and the power voltage may be applied to the source of the first PMOS transistor and the output of the logic gate may be applied to the gate of the first PMOS transistor.

The voltage control unit may further include a write assist circuit that assists a write operation to the memory cells and to the at least one dummy cell in response to the write enable signal.

The write assist circuit may include a second switch that is switched on/off in response to an output of the drain of the first PMOS transistor.

The second switch may include a second PMOS transistor, and the power voltage may be applied to the source of the second PMOS transistor and the drain of the first PMOS transistor may be connected to the gate of the second PMOS transistor.

In accordance with an exemplary embodiment of the present invention a method of operating a memory cell is provided. A dummy memory cell is coupled in parallel with the memory cell to a power voltage source while the dummy memory cell and the memory cell are coupled to a common word line. In response to a control signal that controls a write operation of the dummy memory cell and the memory cell a portion of voltage from the power voltage source is applied to the dummy memory cell as a controlled voltage. In response to a write operation voltage being applied to the common word line to perform the write operation to the memory cell, current is drawn into the dummy memory cell such that a reduced controlled voltage is applied to the memory cell.

The control signal may include a power gating control signal and a write enable signal.

The dummy memory cell may be coupled to the power voltage source through a transistor switch that is activated when the control signal directs a write operation to the memory cell.

The transistor switch may be a PMOS transistor that is switched on when the control signal directs the write operation to the memory cell.

Applying to the dummy memory cell a portion of voltage from the power voltage source may include subtracting a threshold voltage of the PMOS transistor from the power voltage such that a voltage difference is provided to the memory cell as the controlled voltage.

The memory cell may be an SRAM memory cell and the controlled voltage may be applied as a voltage source for a pair of cross-inverters of the SRAM memory cell.

In accordance with an exemplary embodiment of the present invention, an apparatus for controlling a voltage applied to a power line of cross-coupled inverters in an SRAM device during a write operation is provided. The apparatus includes a voltage controller coupled between a power voltage source and the power line, and a dummy memory cell coupled in parallel with the memory cell to the power line and to a common word line. The voltage controller is configured to turn on upon applying a voltage to the common word line during the write operation such that a threshold voltage of a transistor element is subtracted from a voltage of the power voltage source and applied to the power line at the dummy cell, the dummy cell being configured to draw current such that a voltage drop occurs on the power line at the memory cell.

The SRAM device may be a CMOS SRAM and the transistor is a PMOS transistor.

The dummy memory cell may be a CMOS SRAM.

The voltage controller may include a write assist element, the write assist element being responsive to a switching element that controls read and write operations of the SRAM device.

BRIEF DESCRIPTION OF THE DRAWINGS

Exemplary embodiments of the present invention will be more clearly understood from the following detailed description taken in conjunction with the accompanying drawings in which:

FIG. 4 is a flowchart illustrating a method of operating a semiconductor memory device according to an exemplary embodiment of the present invention.

DETAILED DESCRIPTION OF THE EXEMPLARY EMBODIMENTS

Figure 1:
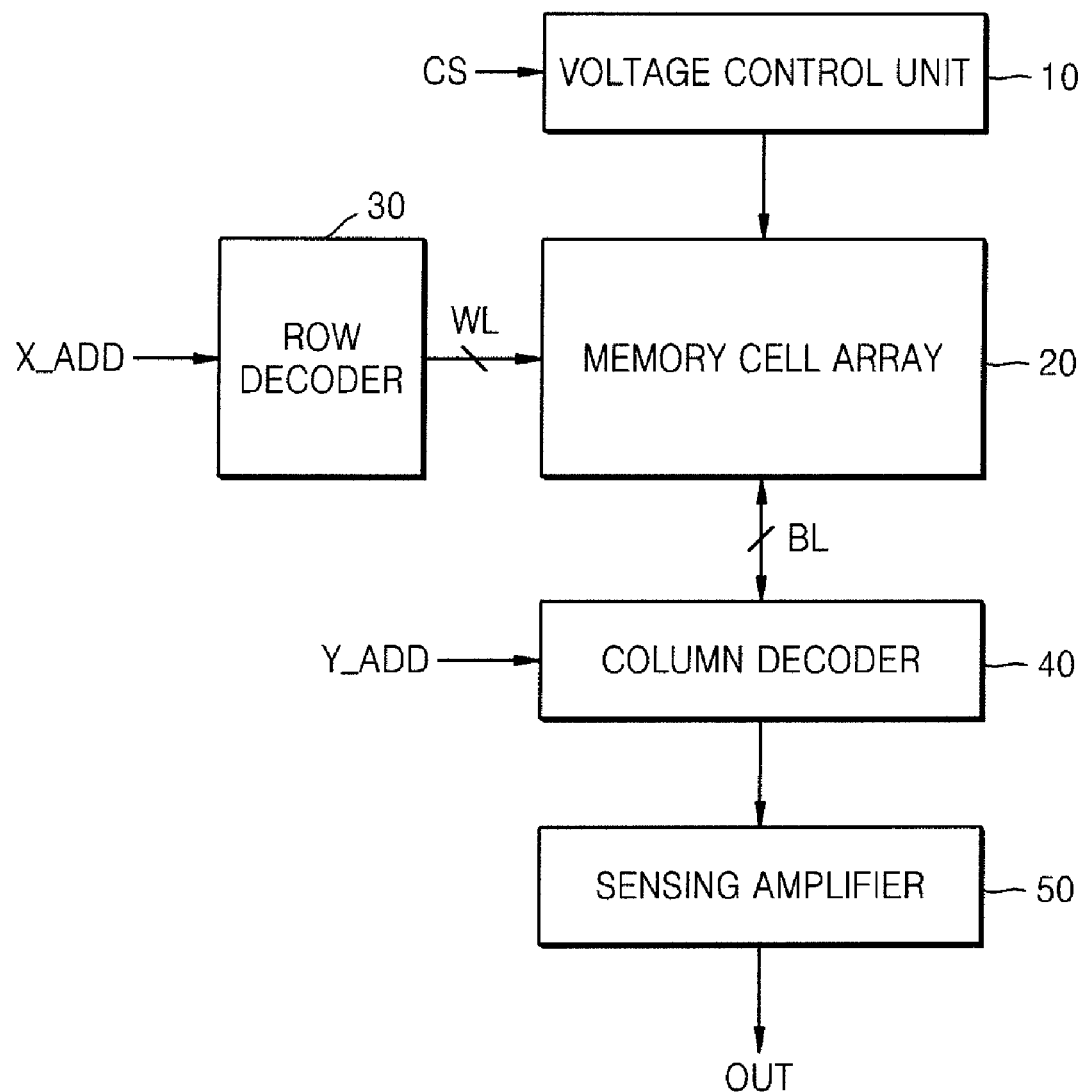
FIG. 1 is a block diagram of a semiconductor memory device according to an exemplary embodiment of the present invention.

Reference will now be made to the exemplary embodiments which are illustrated in the accompanying drawings. However, the exemplary embodiments are not limited to those embodiments illustrated herein.

It will be understood that when an element, such as a component or region, is referred to as being "on," "connected to" or "coupled to" another element, it may be directly on, connected or coupled to the other element or intervening elements may be present. Like reference numerals refer to like elements throughout. It will be understood that, although the terms first and second may be used herein to describe various elements, these elements should not be limited by these terms. These terms are only used to distinguish one element from another element. Thus, a first element discussed below could be termed a second element without departing from the teachings of the exemplary embodiments.

FIG. 1 is a block diagram of a semiconductor memory device according to an exemplary embodiment of the present invention. The semiconductor memory device includes a voltage control unit 10, a memory cell array 20, a row decoder 30, a column decoder 40, and a sensing amplifier 50.

The voltage control unit 10 controls a power voltage applied to the memory cell array 20. More particularly, the voltage control unit 10 controls the magnitude of the power voltage applied to the memory cell array 20 in response to a control signal CS that controls the operation of the memory cell array 20. The memory cell array 20 includes a plurality of memory cells at regions where word lines WLs and bit lines BLs cross each other, and at least one dummy cell.

The row decoder 30 decodes a row address X_ADD to activate a corresponding word line. The column decoder 40 decodes a column address Y_ADD to select a corresponding pair of bit lines. The sensing amplifier 50 amplifies signals output from the column decoder 40 to generate an output signal.

Figure 2:
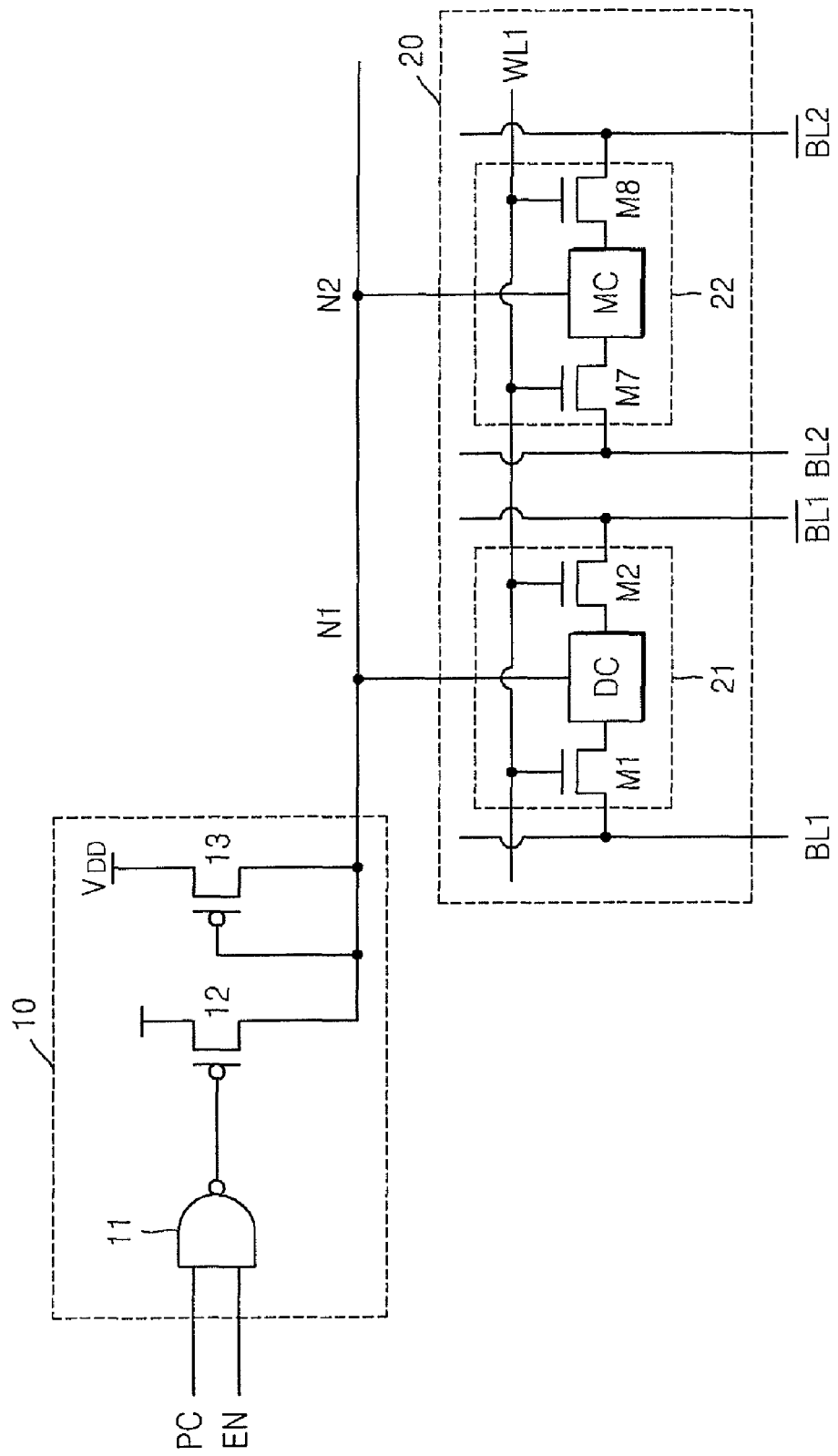
FIG. 2 is a circuit diagram of a voltage control unit and a memory cell array included in the semiconductor memory device of FIG. 1.
Figure 3:
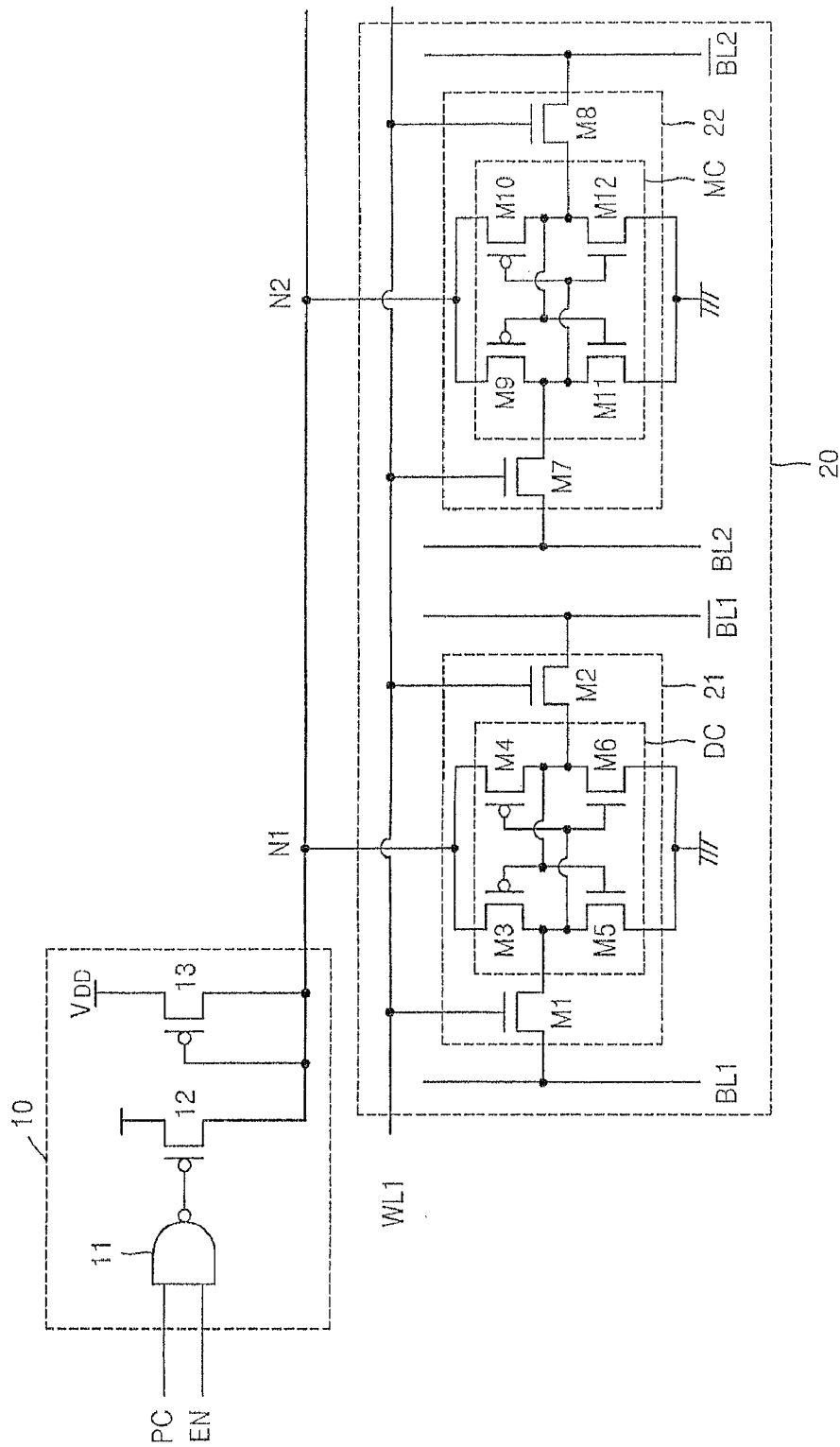
FIG. 3 is a more detailed circuit diagram of the voltage control unit and the memory cell array of FIG. 2.

FIG. 2 is a circuit diagram of the voltage control unit 10 and the memory cell array 20 included in the semiconductor memory device of FIG. 1, according to an exemplary embodiment of the present invention. FIG. 3 is a more detailed circuit diagram of the voltage control unit 10 and the memory cell array 20 of FIG. 2.

Referring to FIGS. 2 and 3, the voltage control unit 10 includes a logic gate 11, a switching element 12, and a write assist circuit 13. As noted above, as memory cells have become miniaturized, the size of memory cells and the power voltage applied to the memory cells have decreased. Accordingly, assisting elements that assist the operation of the memory cells have become prevalent. Thus, in an exemplary embodiment the voltage control unit 10 includes a write assist circuit 13.

The memory cell array 20 includes at least one dummy cell 21 and a plurality of memory cells 22. However, only one dummy cell 21 and only one memory cell 22 are illustrated in FIGS. 2 and 3 as a representative example. In the exemplary embodiment the memory cell 22 is an SRAM cell, but is not limited thereto.

The logic gate 11 performs a logic operation on a power gating control signal PC and a write enable signal EN. In an exemplary embodiment the logic gate 11 is a NAND gate. The power gating control signal PC controls the on/off operation of the voltage control unit 10, and the write enable signal EN is activated when a write operation to the memory cell 21 is performed.

In an exemplary embodiment of the present invention, if the power gating control signal PC is logic "high" and the write enable signal EN is logic "high," the output of the logic gate 11 is logic "low", and a read operation from the memory cell 21 is performed. In addition, if the power gating control signal PC is logic "low" and the write enable signal EN is logic "low," the output of the logic gate 11 is logic "high," and a write operation to the memory cell 21 is performed. If other logic gates are used as the logic gate 11 instead of a NAND gate, the output of the logic gate 11 in response to the power gating control signal PC and the write enable signal EN may change.

The switching element 12 is switched on/off in response to the output of the logic gate 11, and in an exemplary embodiment the switching element 12 is a PMOS transistor having a source connected to a power voltage source and having a gate which receives the output of the logic gate 11. When a read operation from the memory cell 21 is performed, that is, when the output of the logic gate 11 is logic "low," the switching element 12 is turned on. On the other hand, when a write operation to the memory cell 21 is performed, that is, when the output of the logic gate 11 is logic "high," the switching element 12 is turned off.

The write assist circuit 13 assists write operations to the memory cell 22. The write assist circuit 13 is not activated when a read operation from the memory cell 22 is performed, but is activated when a write operation to the memory cell 22 is performed. In an exemplary embodiment of the present invention, the write assist circuit 13 is a PMOS transistor, wherein a source of the PMOS transistor is connected to the power voltage source supplying the voltage VDD and a drain voltage of the switching element 12 is input to the gate of the PMOS transistor. More particularly, when a read operation from the memory cell 22 is performed, the switching element 12 is turned on, and thus the drain voltage of the switching element 12 is logic "high," and the PMOS transistor of the write assist circuit 13 is turned off. On the other hand, when a write operation to the memory cell 22 is performed, the switching element 12 is turned off, and the PMOS transistor 13 is turned on. In this case, the drain voltage of the PMOS transistor of the write assist circuit 13 is a voltage obtained by subtracting a threshold voltage Vtp of the PMOS transistor of the write assist circuit 13 from the voltage VDD of the power voltage source.

The write assist circuit 13 assists write operations to the memory cell 22. The write assist circuit 13 is not activated when a read operation from the memory cell 22 is performed, but is activated when a write operation to the memory cell 22 is performed. In an exemplary embodiment of the present invention, the write assist circuit 13 is a PMOS transistor, wherein a source of the PMOS transistor is connected to the power voltage source supplying the voltage VDD and a drain voltage of the switching element 12 is input to the gate of the PMOS transistor. More particularly, when a read operation from the memory cell 22 is performed, the switching element 12 is turned on, and thus the drain voltage of the switching element 12 is logic "high," and the PMOS transistor of the write assist circuit 13 is turned off. On the other hand, when a write operation to the memory cell 22 is performed, the switching element 12 is turned off, and the PMOS transistor 13 is turned on. In this case, the drain voltage of the PMOS transistor of the write assist circuit 13 is a voltage obtained by subtracting the magnitude of a threshold voltage Vtp of the PMOS transistor of the write assist circuit 13 from the voltage VDD of the power voltage source.

As described above, the voltage control unit 10 includes the write assist circuit 13. Thus, when a write operation to the memory cell 22 is performed, a controlled voltage (VDD−|Vtp|) obtained by subtracting the magnitude of the threshold voltage Vtp of the PMOS transistor of the write assist circuit 13 from the voltage VDD of the power voltage is applied to the memory cell array 20. In general, a write operation to a memory cell is performed by converting a logic "high" value stored in the memory cell to a logic "low" value. When a voltage applied to the memory cell is, as described above, stably decreased to a predetermined level or less, the write operation to the memory cell may be performed faster and more stably.

The dummy cell 21 can be configured to be a cell in which a write operation is not easily performed. That is, when a write operation with respect to the dummy cell 21 is performed, current flowing in the dummy cell 21 is set to be high and a voltage drop at the first node N1 becomes large. Thus, when the first word line WL1 connected to the dummy cell 21 is in an "on" state, the large voltage drop at the first node N1 of the dummy cell 21 occurs. As a result, a reduced voltage is applied to a second node N2 connected to the memory cell 22, and thus a write operation to the memory cell 22 may be stably performed.

Referring to FIG. 3, the data storing region DC includes a pair of inverters cross-coupled to each other. The data storing region DC includes a first inverter having a first PMOS transistor M3 and a first NMOS transistor M5 and a second inverter having a second PMOS transistor M4 and a second NMOS transistor N6. However, in an exemplary embodiment the data storing region DC may include resistors instead of the first and second PMOS transistors M3, M4.

As described above, when a write operation to the memory cell 22 is performed, the write assist circuit 13 is activated, and thus a controlled voltage obtained by subtracting the threshold voltage Vtp of the PMOS transistor of the write assist circuit 13 from the voltage VDD of the power voltage source is applied to the memory cell array 20. In this case, the controlled voltage applied from the voltage control unit 10 is first applied to the dummy cell 21 connected to the first node N1 and is then applied to the memory cell 22 connected to the second node N2. Accordingly, when the write operation to the memory cell 22 starts, the previously reduced voltage can be applied to the memory cell 22 from the first node N1, and thus the write operation may be performed more stably.

As described above, when a write operation to the memory cell 22 is performed, the write assist circuit 13 is activated, and thus a controlled voltage obtained by subtracting the magnitude of the threshold voltage Vtp of the PMOS transistor of the write assist circuit 13 from the voltage VDD of the power voltage source is applied to the memory cell array 20. In this case, the controlled voltage applied from the voltage control unit 10 is first applied to the dummy cell 21 connected to the first node N1 and is then applied to the memory cell 22 connected to the second node N2. Accordingly, when the write operation to the memory cell 22 starts, the previously reduced voltage can be applied to the memory cell 22 from the first node N1, and thus the write operation may be performed more stably.

In another exemplary embodiment of the present invention, even when the voltage control unit 10 does not include the write assist circuit 13, the dummy cell 21 is connected between the voltage control unit 10 and the memory cell 22, and thus the dummy cell 21 can previously reduce the voltage applied to the memory cell 22.

The memory cell 22 is connected to the voltage control unit 10 and the dummy cell 21 via the second node N2. The memory cell 22 is disposed in a region where the first word line WL1 and a second bit line BL2 and a second complementary bit line/BL2 of the cross one another. The memory cell 22 includes first and second access transistors M7, M8 that are respectively connected to the first word line WL1 and the second bit line BL2 and the first word line WL1 and the second complementary bit line/BL2, and a data storing region MC to which the controlled voltage from the voltage control unit 10 is applied.

Referring to FIG. 3, the data storing region MC includes a pair of inverters cross-coupled to each other. The data storing region MC includes a first inverter having a first PMOS transistor M9 and a first NMOS transistor M11 and a second inverter having a second PMOS transistor M10 and a second NMOS transistor M12. However, in an exemplary embodiment, the data storing region MC may include resistors instead of the first and second PMOS transistors M9, M10.

As described above, the controlled voltage applied from the voltage control unit 10 is first applied to the dummy cell 21 connected to the first node N1 before being applied to the memory cell 22. Thus, when a write operation to the memory cell 22 starts, the controlled voltage to be applied to the memory cell 22 is in a stably reduced state at the first node N1, that is, a value obtained by subtracting the magnitude of the threshold voltage Vtp of the PMOS transistor of the write assist circuit 13 from the voltage VDD of the power voltage source. Accordingly, the write operation to the memory cell 22 may be performed even faster and stably.

In addition, the decrease in the voltage applied to the memory cell is generally determined by a current Iwrite flowing in the memory cell. However, in conventional semiconductor memory devices, relative to the capacitance of the memory cell measured at the node between the voltage control unit and the memory cell, the current Iwrite flowing in the memory cell is not sufficiently high. Thus, the controlled voltage is not sufficiently reduced in a limited write operation time, that is, within a time period in which the word line is in an "on" state. For example, when the capacitance of the memory cell is 400 fF, the current Iwrite flowing in the memory cell is 5 uA, the write operation time is 2 ns, and the decrease in the controlled voltage is only 25 mV.

However, as described above, when the dummy cell 21 is disposed between the voltage control unit 10 and the memory cell 22, according to an exemplary embodiment of the present invention, the decrease in the controlled voltage occurs at the first node N1 in the write operation time, that is, when the first word line WL1 is in an "on" state, and the reduced controlled voltage is then applied to the second node N2. Therefore, a write operation of the memory cell 22 may be performed fast and stably, and a voltage margin of the write operation can be increased.

In an exemplary embodiment the first access transistor M7 is an NMOS transistor, wherein the gate of the NMOS transistor is connected to the first word line WL1 and the drain thereof is connected to the second bit line BL2, and the second access transistor M8 is an NMOS transistor, wherein the gate of the NMOS transistor is connected to the first word line WL1 and the source thereof is connected to the second complementary bit line/BL2.

FIG. 4 is a flowchart illustrating a method of operating a semiconductor memory device, according to an exemplary embodiment of the present invention. In step 400, in response to a control signal that controls the operation of a plurality of memory cells, a power voltage is controlled, thereby obtaining a controlled voltage. In this regard, the control signal may include a power gating control signal and a write enable signal.

In step 410, the controlled voltage is applied to at least one dummy cell, and then applied to the plurality of memory cells.

In step 420, a read operation or write operation is then performed with respect to each of the plurality of memory cells in response to a voltage of a plurality of word lines and a plurality of bit lines. In this regard, the controlled voltage is respectively applied to the plurality of memory cells and the at least one dummy cell, wherein each of the plurality of memory cells and the at least one dummy cell includes first and second inverters cross-coupled to each other and first and second access transistors. In addition, the widths of channels of the first and second access transistors included in the at least one dummy cell may be greater than the widths of channels of the first and second access transistors included in each of the plurality of memory cells.

While exemplary embodiments of the present invention has been described with regard to SRAM devices, exemplary embodiments of the present invention may also include a method and apparatus for applying compute readable codes onto various other compute readable recording medium. The compute readable recording medium is any data storage device that can store data which can be thereafter read by a computer system. Examples of the computer readable recording medium include read-only memory (ROM), random-access memory (RAM), CD-ROMs, magnetic tapes, floppy disks and optical data storage devices. The computer readable code can also be distributed over network coupled computer systems so that the computer readable code can be stored and executed in a distributed fashion. Here, a program stored in a recording medium is expressed in a series of instructions used directly or indirectly within a device with a data processing capability, such as, computers. Thus, a term "computer" involves all devices with data processing capability in which a particular function is performed according to a program using a memory, input/output devices, and arithmetic logic.

The foregoing is illustrative of exemplary embodiments and is not to be construed as limiting thereof. Although exemplary embodiments have been described, those skilled in the art will readily appreciate that many modifications are possible without materially departing from the exemplary embodiments. Accordingly, all such modifications are intended to be included within the scope of the claims. Therefore, it is to be understood that the foregoing is not to be construed as limited to the specific embodiments disclosed, and that modifications to the disclosed embodiments, as well as other embodiments, are intended to be included within the scope of the appended claims.

What is claimed is:

1. A semiconductor memory device comprising:
   a plurality of word lines;
   a plurality of pairs of bit lines and complementary bit lines;
   a plurality of memory cells, each memory cell being at a region where a respective word line and a pair of a bit line and a complementary bit line cross each other;
   a voltage control unit that controls a power voltage to obtain a controlled voltage appliable to the memory cells in response to a control signal that controls an operation of the memory cells; and
   at least one dummy cell disposed between the voltage control unit and the memory cells and configured to reduce the controlled voltage to a predetermined level,
   wherein the at least one dummy cell and a memory cell are connected in parallel both to the voltage control unit and to a word line common to the memory cell and the at least one dummy cell, and
   wherein widths of channels of a first access transistor and a second access transistor in the at least one dummy cell are greater than widths of channels of the first access transistor and the second access transistor in each of the plurality of memory cells.

2. The semiconductor memory device of claim 1, wherein each of the memory cells and the at least one dummy cell comprises:
   a first inverter and a second inverter to which the controlled voltage is applied and that are cross-coupled to each other;
   a first access transistor disposed between a first bit line of the pair and an output terminal of the first inverter and is switched on/off by a first word line of the plurality of word lines; and
   a second access transistor disposed between a first complementary bit line corresponding to the first bit line and an output terminal of the second inverter and is switched on/off by the first word line.

3. A semiconductor memory device comprising:
   a plurality of word lines;
   a plurality of pairs of bit lines and complementary bit lines;
   a plurality of memory cells, each memory cell being at a region where a respective word line and a pair of a bit line and a complementary bit line cross each other;
   a voltage control unit that controls a power voltage to obtain a controlled voltage appliable to the memory cells in response to a control signal that controls an operation of the memory cells; and
   at least one dummy cell disposed between the voltage control unit and the memory cells and configured to reduce the controlled voltage to a predetermined level,
   wherein each of the memory cells and the at least one dummy cell comprises:
      a first inverter and a second inverter to which the controlled voltage is applied and that are cross-coupled to each other;
      a first access transistor disposed between a first bit line of the pair and an output terminal of the first inverter and is switched on/off by a first word line of the plurality of word lines; and
      a second access transistor disposed between a first complementary bit line corresponding to the first bit line and an output terminal of the second inverter and is switched on/off by the first word line, and wherein widths of channels of the first access transistor and the second access transistor in the at least one dummy cell are greater than widths of channels of the first access transistor and the second access transistor in each of the plurality of memory cells.

4. The semiconductor memory device of claim 1, wherein the control signal comprises a power gating control signal and a write enable signal.

5. The semiconductor memory device of claim 4, wherein the voltage control unit comprises:
   a logic gate that performs a logic operation on the power gating control signal and the write enable signal; and
   a first switch that is switched on/off in response to an output of the logic gate.

6. The semiconductor memory device of claim 5, wherein the logic gate comprises a NAND gate that performs a NAND operation on the power gating control signal and the write enable signal.

7. The semiconductor memory device of claim 5,
   wherein the first switch comprises a first PMOS transistor, and
   wherein the power voltage is applied to the source of the first PMOS transistor and the output of the logic gate is applied to the gate of the first PMOS transistor.

8. The semiconductor memory device of claim 7, wherein the voltage control unit further comprises a write assist circuit that assists a write operation to the memory cells and to the at least one dummy cell in response to the write enable signal.

9. The semiconductor memory device of claim 8, wherein the write assist circuit comprises a second switch that is switched on/off in response to an output of the drain of the first PMOS transistor.

10. The semiconductor memory device of claim 9,
    wherein the second switch comprises a second PMOS transistor, and
    wherein the power voltage is applied to the source of the second PMOS transistor and the drain of the first PMOS transistor is connected to the gate of the second PMOS transistor.

11. An apparatus for controlling a voltage applied to a power line of cross-coupled inverters in an SRAM device during a write operation, the apparatus comprising:
    a voltage controller coupled between a power voltage source and the power line; and
    a dummy memory cell coupled in parallel with the memory cell to the power line and to a common word line,
    wherein the voltage controller is configured to turn on upon applying a voltage to the common word line during the write operation, such that a threshold voltage of a transistor element is subtracted from a voltage of the power voltage source and applied to the power line at the dummy memory cell, and
    wherein the dummy memory cell is configured to draw current such that a voltage drop occurs on the power line at the memory cell, and
        wherein widths of channels of a first access transistor and a second access transistor in the at least one dummy cell are greater than widths of channels of the first access transistor and the second access transistor in each of the plurality of memory cells.

12. The apparatus of claim 11, wherein the SRAM device is a CMOS SRAM and the transistor is a PMOS transistor.

13. The apparatus of claim 11, wherein the dummy memory cell is a CMOS SRAM.

14. The apparatus of claim 11, wherein the voltage controller comprises a write assist element, the write assist element being responsive to a switching element that controls read and write operations of the SRAM device.

* * * * *